United States Patent [19]

Bailey et al.

[11] 4,039,890
[45] * Aug. 2, 1977

[54] INTEGRATED SEMICONDUCTOR LIGHT-EMITTING DISPLAY ARRAY

[75] Inventors: Paul T. Bailey, Creve Coeur; M. George Craford, St. Louis, both of Mo.; Alexander G. Findlay, Cupertino; Robert K. Underwood, San Jose, both of Calif.

[73] Assignee: Monsanto Company, St. Louis, Mo.

[*] Notice: The portion of the term of this patent subsequent to Feb. 24, 1993, has been disclaimed.

[21] Appl. No.: 622,936

[22] Filed: Oct. 16, 1975

Related U.S. Application Data

[63] Continuation of Ser. No. 498,142, Aug. 16, 1974, abandoned.

[51] Int. Cl.² .................................... H05B 33/02
[52] U.S. Cl. .......................... 313/500; 315/169 TV
[58] Field of Search ................ 313/499, 500; 357/17; 315/169 TV; 340/324 M

[56] References Cited

U.S. PATENT DOCUMENTS

| 3,353,051 | 11/1967 | Barrett et al. | 313/499 X |
| 3,443,140 | 5/1969 | Ing, Jr. et al. | 313/499 |
| 3,512,041 | 5/1970 | Dalmasso | 357/17 X |
| 3,558,974 | 1/1971 | Stewart | 313/500 X |
| 3,648,120 | 3/1972 | Hakki | 357/17 |
| 3,703,656 | 11/1972 | Barnett et al. | 315/169 TV X |
| 3,737,704 | 6/1973 | Grenon et al. | 313/500 |
| 3,807,036 | 4/1974 | Fischer | 29/577 |
| 3,807,037 | 4/1974 | Fischer | 29/577 |
| 3,813,587 | 5/1974 | Umeda et al. | 357/17 |

Primary Examiner—Palmer C. Demeo
Attorney, Agent, or Firm—Peter S. Gilster; Harold R. Patton

[57] ABSTRACT

A composite semiconductor light-emitting display array. Light is emitted and observed through a light-transmissive planar array of LED devices formed in a monolithic transparent single crystal such as GaP. Light is generated at the back of the single crystal, but is observed through the front of the crystal. The crystal with its array of LED's is directly interconnected with a monolithic circuit having circuit elements for energizing the LED devices. The result is a composite sandwich structure with interconnections sandwiched between the LED array and the integrated circuit.

8 Claims, 5 Drawing Figures

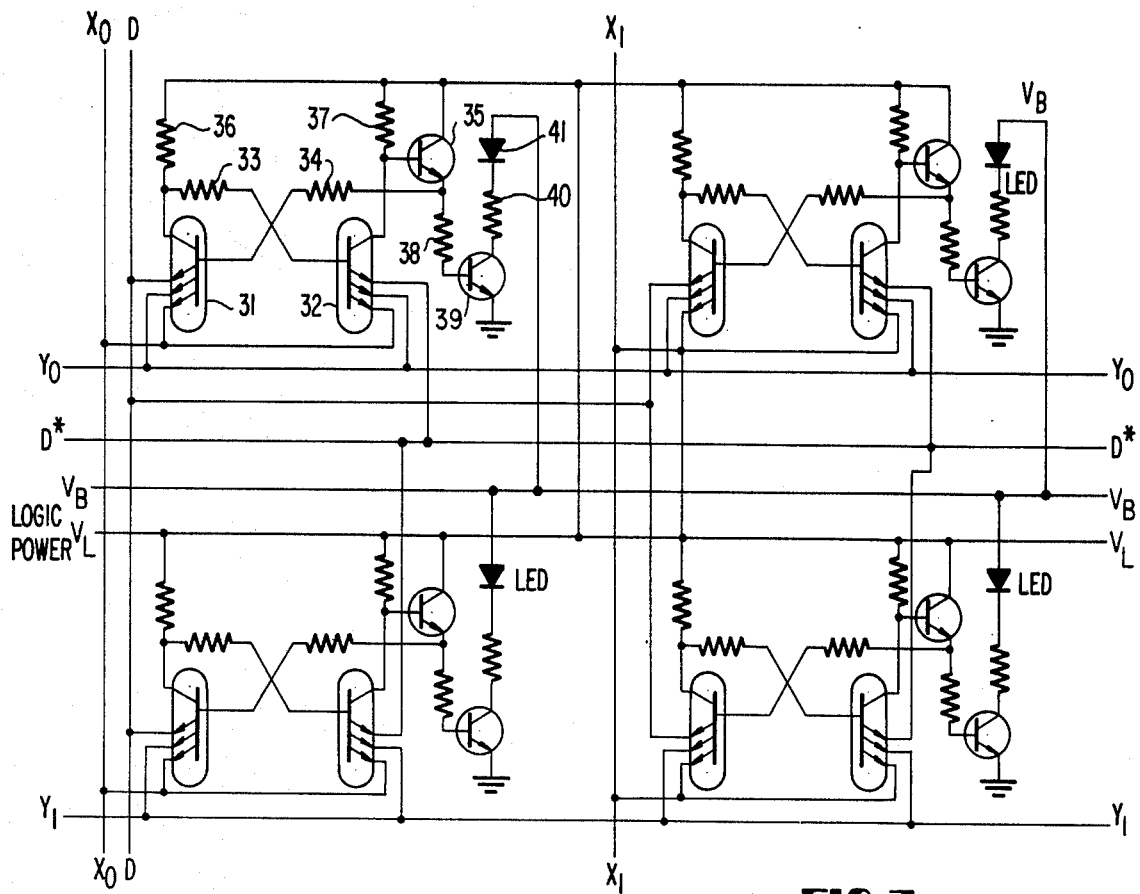
FIG. 3
FIG. 5
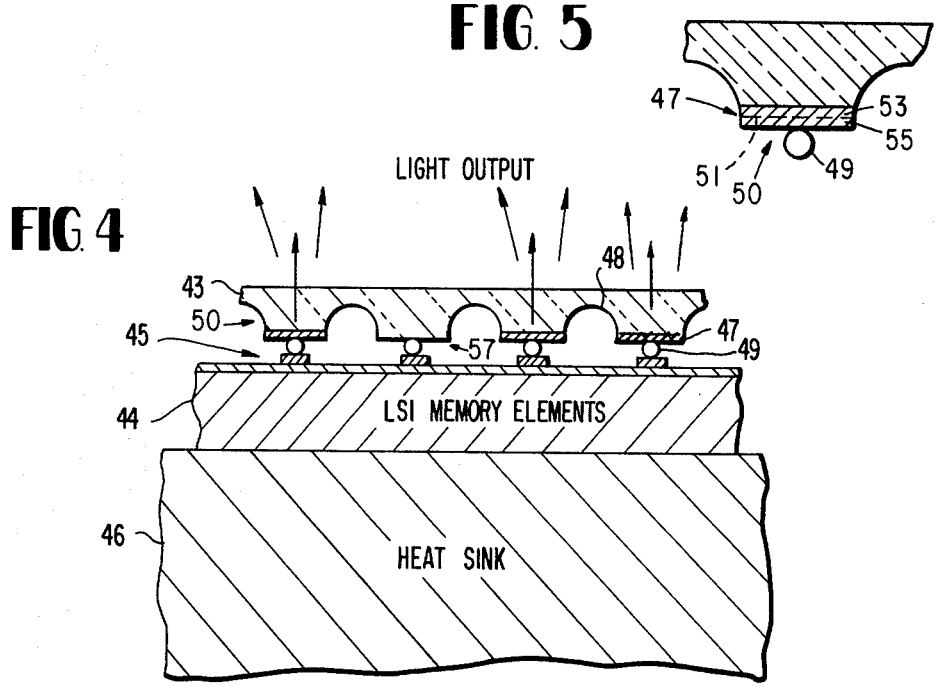
FIG. 4

INTEGRATED SEMICONDUCTOR LIGHT-EMITTING DISPLAY ARRAY

This is a continuation of application Ser. No. 498,142, filed Aug. 16, 1974, now abandoned.

BACKGROUND OF THE INVENTION

The present invention relates generally to the visual display devices, and more particularly, to a composite integrated circuit light-emitting display array using LED (light-emitting diode) devices in planar array in a transparent, monolithic crystal wherein the light is generated at the back of the crystal, but is transmitted through the crystal and is observed from the front surface of the crystal.

Heretofore, semiconductor light-emitting devices (whether of discrete, matrix, or array types) have been utilized in a fashion in which light was generated at or close to a "front" surface which is viewed by the observer. It has recently been proposed to construct LED devices from a transparent crystal in which light is generated at the "back" surface of the crystal but is transmitted through it and viewed from the front of the crystal. It is herein proposed to utilize this concept in a composite semiconductor array which includes an integrated circuit. The array disclosed is of an X-Y addressable configuration, i.e., a solid state planar array.

In the past, a variety of devices for non-permanent visual presentation of information has been available. Perhaps one of the most widely used and accepted visual display devices is the cathode ray tube. While the cathode ray tube has served admirably in many diverse applications, it does suffer many disadvantages which limits its future use in many applications. These include high-voltage requirements (usually of the order of 15,000 volts or more) and X-ray and radio frequency emissions which are attendant to such high voltages requiring shielding in order to reduce radio-frequency interference. In addition, cathode ray tubes are expensive owing to their complexity of manufacture and their relatively short lifetime requiring periodic replacement. The low light output of cathode tube displays requires care to prevent glare from the ambient surroundings from preventing the readability of the display. Even under ideal conditions, cathode ray tube displays being analog in nature have poor resolution with accuracies achievable only to about 2%. Furthermore, the large size and weight and the non-ruggedness of the cathode ray displays prevent their use in many environments where space is at a premium and rugged, dependable construction is a prerequisite.

Another type of display is the so-called plasma discharge (or simply "gas discharge") display, in which gas between planar electrodes in a gas-filled envelope is excited by voltages across the electrodes provides emission of light. Such devices require relatively high energizing voltages, are somewhat bulky, and have limited lifetime. Because of their higher energizing voltages, they are not directly compatible with semiconductor circuitry of the type employed in integrated circuits.

These and other types of displays are described, and their relative merits noted, in the article entitled "Circuit/System Building Blocks" by Lapidus, G., in *IEEE Spectrum*, Vol. II, No. 1, January, 1974, p. 54.

Recently, semiconductor light-emitting devices have been developed. The development of these devices has given rise to the forecast of a solid state planar display that will overcome all of the above limitations of cathode ray tube displays and, perhaps, have many other added benefits. However, while these light-emitting devices lend themselves to X-Y scanning, a simple X-Y matrix of solid-state light-emitting devices has many drawbacks. One major disadvantage to X-Y scanning of a large array which may have of the order of 500,000 light-emitting devices, is that high-peak currents are required for very short period of time. For example, assume that a planar display has 500,000 light-emitting devices in a 7 × 7 inches format with 100 light-emitting devices to the inch. A 10 mA DC current is required for each light-emitting device to provide an average display brightness of 1,000 lumens per square foot. For a frame rate of 50Hz, the clock scan-rate must be greater than, or equal to, 25 MHZ. Under these conditions, it can be calculated that the peak current in any light-emitting device in the array will be 5000 A. Even with two orders of magnitude reduction in DC current in the light-emitting devices, the peak current would be approximately 50 A. This is intolerable and presents an almost insolvable problem when one considers the potential radio-frequency interference in addition to the small conductor cross-sectional areas associated with an array of the above dimensions.

SUMMARY OF THE INVENTION

Among the several objects of the invention are the provision of a composite integrated semiconductor LED display array having the high-contrast, brightness and resolution potential of such displays; the provision of such an array providing for compact, economical, relatively simple integration of semiconductor light-emitting diode devices with semiconductor circuitry for energization of the light-emitting diode devices with semiconductor circuitry for energization of the light-emitting devices; and the provision of such an array which is directly compatible with semiconductor circuitry.

The foregoing and other objects of the invention are attained by providing a sandwich structure comprising a monolithic array of light-emitting devices and a monolithic silicon semiconductor integrated circuit with multilayer metallization and interconnections sandwiched between the two. The monolithic array of light-emitting devices comprises a single light-transmissive crystal, (i.e., transparent GaP), and the light is generated at the back of the crystal adjacent to the interface with the integrated circuit. The light is transmitted through the crystal and observed through the front of the crystal. The integrated circuit comprises an array of circuit elements which provide the driving current for energizing respectiveness of the light emitting devices in the transparent crystal.

The electrical interconnections sandwiched between the arrays connect respective ones of the light-emitting devices and circuit elements at the back surface of the crystal, the circuit elements being selectively operable for energizing corresponding ones of the light-emitting devices thus providing display of light patterns (such as alpha-numeric characters) which are observed at the front surface of the light-emitting array.

Other objects and features are apparent or are pointed out below.

BRIEF DESCRIPTION OF THE DRAWINGS

FIG. 3 is a detailed schematic diagram of a 2 × 2 matrix of memory elements and light-emitting devices;

FIG. 4 is a cross-sectional view of the integrated semi-conductor light-emitting display array according to the invention; and FIG. 5 is enlarged cross-sectional view of one so-called mesas of the crystal in which such light-emitting devices are formed.

Corresponding reference characters indicate corresponding parts throughout the view of the drawings.

DESCRIPTION OF THE PREFERRED EMBODIMENT

Figure 1:
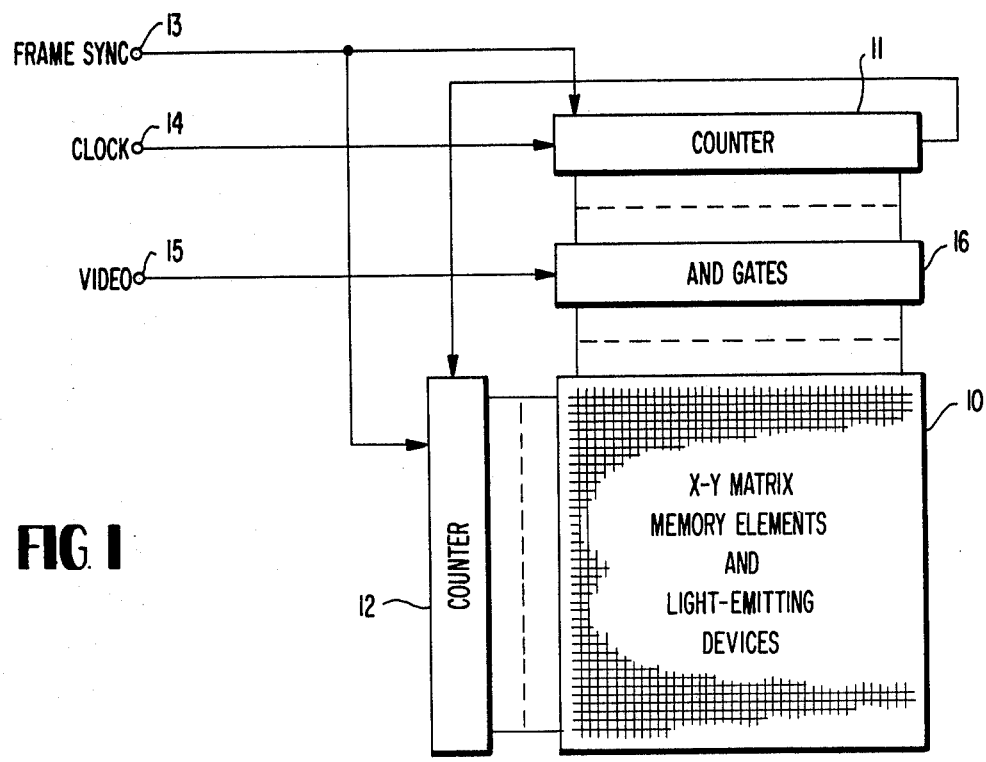
FIG. 1 is a block diagram illustrating a typical display array in the form of an X-Y matrix of integrated circuit memory elements and light-emitting devices according to the invention.

Referring now to FIG. 1 of the drawings, a composite integrated circuit light-emitting display array 10 according to the invention is generally illustrated as an X-Y matrix of integrated memory circuit elements and solid state light-emitting devices. This X-Y matrix array 10 can be addressed in any number of well-known ways. Either serial or parallel formats may be used; however, for purposes of illustration, FIG. 1 illustrates a raster-scanning address circuit comprising an X counter 11 and a Y counter 12. Both te X counter 11 and the Y counter 12 are reset to zero by a frame sync pulse applied to terminal 13. A clock of suitable pulse repetition rate is applied to the X counter 11 at terminal 14. Both the X counter 11 and the Y counter 12 may be constructed by using a conventional binary counter comprising a cascaded series of bistable multivibrators and an appropriate decoding network so that the counters provide only a single output corresponding to a specific column or row, respectively. Thus, with each clock pulse applied to terminal 14, the X counter 11 provides a single output which advances from column 1 to column $n$ of the X-Y matrix array 10 in synchronism with the clock. When the X counter 11 reaches the last or $n$ count, it also provides an output to the input of the Y counter 12. Thus, the Y counter 12 which selects the rows of the X-Y matrix array 10 counts at a rate of $1/n$ that of the X counter 11. The Y counter 12 operates in a manner similar to that of the X counter 11, providing a single output which advances from row 1 to row $n$ in synchronism with the $n$th count of the X counter 11. A complete cycle of the Y counter 12 constitutes one frame.

The video signal in the form of a serial binary code synchronized with the clock is applied to terminal 15 connected to a series of AND gates 16, one of each column of the X-Y matrix array 10. The X counter 11 enables only one of the AND gates 16 at any one time. The video signal applied at terminal 15 is connected to all of the AND gates 16 so that the video signal will be passed by the enabled AND gate corresponding to the column selected by the X counter 11. As will be explained in more detail, the coincidence of row and column outputs from the Y counter 12 and the AND gates 16, respectively, selects a specific memory element and its associated light-emitting device in the X-Y matrix array 10. This selection triggers the memory element which in turn provides the current to drive the light-emitting device.

It will be appreciated from the foregoing description that the integrated semiconductor display array according to the invention is shown in FIG. 1 as being addressed by a scheme analogous to a conventional TV raster. In such a system, both the frame sync pulse applied at terminal 13 and the clock pulses applied at terminal 14 are derived directly from suitable video signal input in a manner well known to those skilled in the art. It should be emphasized, however, that the present invention is not limited to the specific means for addressing the display array and that the system shown in FIG. 1 is for purposes of explanation only. For example, one or the other of counters 11 and 12 may be replaced by a register in which binary data is transferred to the array in parallel. This eliminates scanning in one of the X or Y directions, thereby greatly reducing the time required to address the entire array. Other methods of addressing the array will readily suggest themselves to those skilled in the art.

The addressing scheme illustrated in FIG. 1 sets selected ones of the memory elements in the X-Y matrix array 10. According to the principles of the invention, it is also necessary to reset the memory elements in the X-Y matrix 10 after a predetermined time. This is readily accomplished, for example, by a second pair of X and Y counters (not shown in order to simplify the drawings) which are identical to counters 11 and 12. The second pair of X and Y counters are also reset by the frame sync pulse but delayed by a time equal to about 90% of the frame period. Obviously, there are no AND gates interposed between the X counter of this second pair of counters and the X-Y matrix 10 since the purpose of this second pair of counters is to reset rather than set the memory elements in the matrix. Illustration of this second pair of counters has been omitted in order to avoid unduly complicating the drawing.

Figure 2:
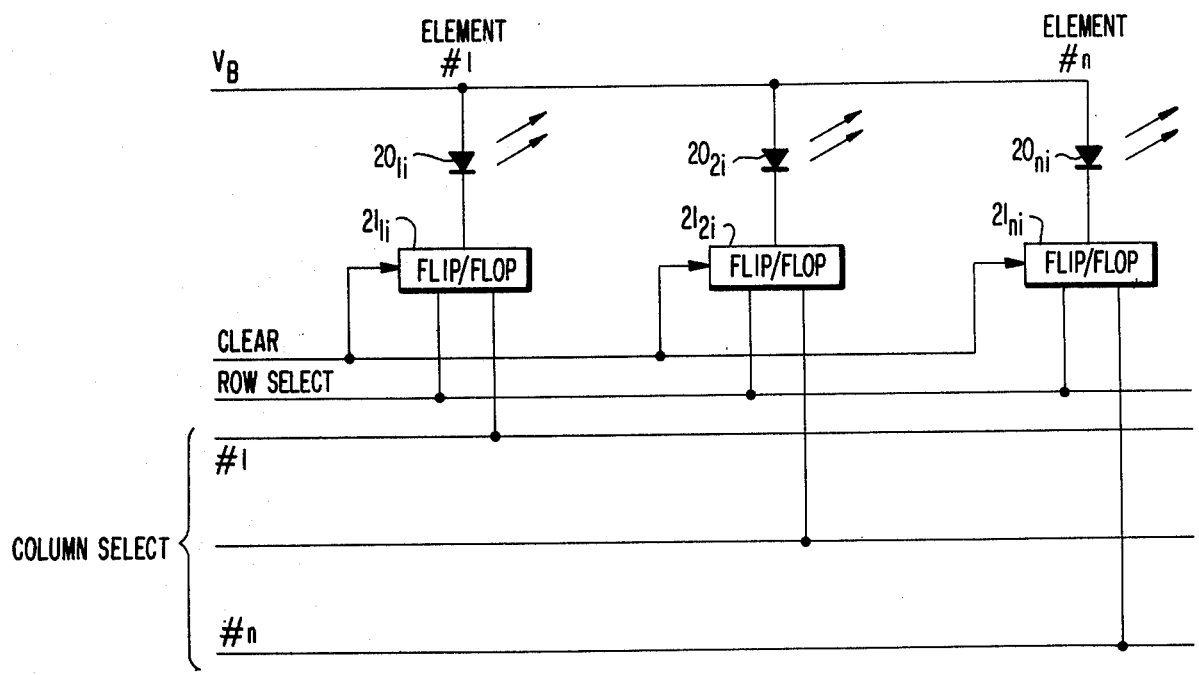
FIG. 2 is a simplified schematic diagram of one row in the X-Y matrix illustrating the operation of the memory elements in combination with the light-emitting devices.

A simplified schematic diagram for one row of elements in the X-Y matrix 10 is shown in FIG. 2. In this figure, the light-emitting devices are represented by light-emitting p-n junction diodes (LED's) $20_{li}$ to $20_{ni}$ where the first number of the subscript represents the column and the second number represents the row of that particular LED. While the light-emitting p-n junction diodes are illustrated, any semiconductor light-emitting device may be used. Thus, aspects of the invention embrace not only p-n junction diodes, but also a simple semiconductor monode (e.g., electroluminescence, such as employed in ZnS electroluminescent panels) and also more complex structures such as of p-i-n, p-n-p, and similar configurations, junction semiconductor devices capable of emitting light. Each of the light-emitting diodes $20_{li}$ to $20_{ni}$ are connected to a corresponding memory circuit element, viz. flip-flops $21_{li}$ to $21_{ni}$. Each of flip-flops $21_{li}$ to $21_{ni}$ have two inputs, one corresponding to its associated column and, in this case, one corresponding to the ith row. In order for any of the flip-flops $21_{li}$ to $21_{ni}$ to be set (i.e., to transition from the first state to the second state), pulses on the two input lines or leads must be coincident. Once set, the flip-flops remain set regardless of the status of either of their two inputs until they are reset by a clear pulse. While the clear pulse is indicated as being simultaneously to all of the flip-flops $21_{li}$ to $21_{ni}$ by means of a single clear line, it will be appreciated that the flip-flops may be individually reset in the same manner in which they were set, if desired. The anodes of the light-emitting diodes $20_{li}$ to $20_{ni}$ are each connected to a source of supply voltage $V_B$.

In operation, the flip-flops in the display array are scanned in the X and Y directions corresponding to the columns and rows of the array. This scanning operation requires very low power. Coincidence of an X and Y pulse at a particular flip-flop will set or change the state of that flip-flop, causing its associated light-emitting diode to emit light. An important aspect of this invention resides in the fact that once set, a flip-flop remains in the set condition (the second state) until reset to the first state thereby causing current to flow in its light-emitting diode for a relatively long period of time. This greatly reduces the peak current required for each LED to achieve a certain level of brightness of emitted light. This is due to the fact that the brightness of the emitted light from an LED or the like is directly proportional to the average current in the diode. By maintaining the diode in a conducting state for a longer period of time, the same average current can be realized at a much lower value of peak current.

In a simple on/off single-color display of the invention, total display brightness variation can be achieved by control of the $V_B$ voltage line. In the case of a shades-of-gray type single-color display, memory external to that illustrated in FIG. 2 is additionally required, in which case the light-emitting diodes are turned on by scanning as described above. However, to turn the light-emitting diodes off at different times corresponding to the required shades-of-gray modulation, further scanning is required to extinguish discrete elements. State-of-the-art digital computer technology is readily utilized for this purpose. In the case of an on/off multicolor or multicolor shades-of-gray display employing the invention, the electronics associated with the display array are identical to that required for the single color displays just described.

FIG. 3 shows a detailed schematic diagram of a simple 2 × 2 matrix of memory elements and light-emitting devices which is suitable for implementation in an integrated semiconductor array embodying the present invention. Since each memory element and the control circuitry for its associated light-emitting device is identical within the matrix, only the circuitry of that memory element and its associated light-emitting device shown in the upper left hand corner of the figure are described in detail. Each memory element comprises a flip-flop having two multiple emitter transistors 31 and 32. Transistors 31 and 32 are cross-coupled in the usual fashion to form a bistable multivibrator. This cross-coupling is in the form of a resistor 33 connected between the collector of transistor 31 and the base of 32 and a resistor 34 connected between the base of transistor 31 and the emitter of another transistor 35. Transistor 35 is connected as an emitter-follower and has its base connected to the collector of transistor 32. Each of transistors 31 and 32 are provided with load resistors 36 and 37, respectively, which are connected to a source $V_L$ of logic-controlled power. The collector of transistor 35 is also connected to the source of light-controlled power, while the emitter of transistor 35 is connected through a load resistor 38 to the base of another drive transistor 39. Transistor 39 is connected in common emitter fashion with its emitter connected to ground and its collector being connected through a load resistor 40 and a light-emitting diodes 41 to a source of voltage $V_B$. The first emitter of transistor 31 and 32 are both connected to the $X_O$ column address line, and the second emitter of each of transistors 31 and 32 are connected to the $Y_O$ row address line. The third emitter of transistor 31 is connected to a D select line, and the third emitter of transistor 32 is connected to a D* select line.

The D and D* select lines relate to logic control functions which may be used to clear or reset the memory elements in the display array. Both decoding and memory functions are performed by the multiple emitter transistors. Should either the X or Y address lines be low, the flip-flop will remain in its present state. When both X and Y address lines are high indicating that the memory element has been selected in the scanning operation, the flip-flop will remain in its present state unless either the D or D* line is high. Thus, for example, with the D* line high and the D line at ground potential, the flip-flop will be set with transistor 31 in the conducting state and transistor 32 in the nonconducting state. When transistor 32 is in the non-conducting state, a positive potential appears at the base of transistor 35 causing it to conduct turning on transistor 39. With transistor 39 conducting, a conduction path is established for the light-emitting diode 41 causing it to emit light. While both the D and D* select line are at ground potential, the flip-flop will remain in its set or reset state irrespective of the state of the X and Y address lines. The flip-flop is reset by a high level appearing on the D select line and ground potential appearing on the D* select line, thereby causing transistor 32 to conduct and transistor 31 to cease conduction. This arrangement of D and D* select lines allows complete freedom in how data update can be performed. For example, random updating can occur as data changes, all memory elements can be cleared, data can be refreshed on a scan basis, and so forth.

The physical construction of the monolithic light-emitting diode display array according to the invention is shown in cross-section in FIG. 4 of the drawings. The array is a sandwich structure comprising a monolithic array 43 of individual light-emitting diodes 43a, 43b and so forth and a monolithic silicon large scale integrated circuit (LSI) 44 with a multilayer metallization and spherical interconnections generally indicated at 45 sandwiched between the two. The LSI silicon circuit comprising the array of memory elements is mounted on a metallic heat sink 46 to provide both rigidity and even thermal distribution.

A characteristic feature of this invention resides in the fact that the light is generated at the p-n junctions back of the crystal of the array 43, or adjacent the interconnections 45 with the LSI circuit 44. Thus, for example, if light-emitting diodes are used as the semiconductor light-emitting devices, then the crystal of array 43 is preferably bulk monocrystalline GaP with the p-n junctions, representatively indicated as part of p-n junction regions of the diodes on the back surface of the crystal. Since the GaP crystal is transparent, the light generated at the p-n junctions is observable from the front surface as indicated by the arrows in the drawing.

The monolithic array of light-emitting devices 43 is shown deeply etched on the p-n junction side at 48 providing deep channels which form a grid which isolates each light-emitting diode area. Such an etched grid has two advantages. First, it provides a reflector system to improve light from the array 43. Second, the grid effectively reduces the optical cross-talk between adjacent elements in the array because of the optical isolation it provides.

The channels of the grid 48 effectively cause the back surface of crystal 48 to be constituted by individual mesas 50 arranged in rows and columns so that the face of each such mesa has a rectangular shape. Each mesa 50 contains a p-n junction region 47 and thus each mesa forms an LED.

A representative p-n junction in such a mesa 50 is illustrated at 51 in FIG. 5., with a layer or region of n-type conductivity shown at 53 and a thin surface layer or region of p-type conductivity shown at 55. The p-regions may be formed by diffusing a dopant such as zinc into epitaxially grown n-type material.

It will be understood, of course, that suitable metallization (not shown) or other contact means is applied to the GaP crystal in order to apply the energizing potential across the individual junction regions 47. Alternatively, one of the mesas such as that designated 57 may be free of the p-type surface layer so as to provide electrical interconnection between the memory circuit elements and the body of crystal 43. In either case, all of the opposite sides of the individual diodes are contacted via the body of the crystal.

Spherical metal contacts 49 are preferably used between the multilayer metallization 45 and the p-layer 55 of the individual p-n junction regions 47 to provide good electrical contact between one side of each of the light-emitting diodes and the associated memory elements in the LSI circuit.

The resultant sandwiched construction and electrical interconnection may be referred to as of flip-chip configuration and permits an extremely compact fabrication of the integrated semiconductor display array according to the invention.

In the specific example given in FIG. 4 of a GaP crystal, a single color (green) display is provided. Other colors, however, can also be achieved in this display array. For example, the basic GaP crystal can have arsenic diffused on the p-n junction side to provide GaAsP diodes which produce red light. Or, the GaP may be doped with a isoelectronic impurity such as nitrogen in a magnitude sufficient to produce a spectral shift from green toward yellow or yellow-green. In any event, the basic GaP crystal is transparent to the emitted light. Other combinations and materials can be readily envisioned by those skilled in the art to provide different color or multicolor display.

The invention herein described contemplates also the use of a multicolor LED display array as disclosed in the U.S. application of M. G. Craford et al., Ser. No. 497,992, filed Aug. 16, 1974, entitled "Integrated Semiconductor Light-Emitting Display Array."

In view of the foregoing, it will be seen that the several objects of the invention are achieved and other advantages attained.

It will be apparent that the embodiment shown is only exemplary and that various modifications can be made in construction and arrangement without departing from the scope of the invention. Accordingly, it is intended that all matter contained in the foregoing description or shown in the accompanying drawings be interpreted as illustrative rather than in a limiting sense.

What is claimed is:

1. A composite integrated circuit LED display array of sandwich configuration comprising:
   a planar monolithic light-transmissive single crystal of GaP having a plurality of LED devices integrally formed on the back surface of said crystal in an X-Y array, said LED devices being optically isolated, the optical isolation being effected by a deeply etched grid on the back surface of said crystal;
   a monolithic integrated circuit array of memory circuit elements corresponding to respective ones of said LED devices said integrated circuit being integrally joined to said light-transmissive crystal at the back side thereof, said memory circuits being selectively addressable to cause energization of the respective LED devices to emit light at the back surface of said crystal, the light being transmitted through said crystal for being observed at the front surface of said crystal.

2. A composite integrated circuit LED display array of sandwich configuration comprising:
   a light-transmissive monolithic planar X-Y array of LED devices disposed in a plurality of rows and columns, said array comprising a monolithic, light-transmissive single crystal, of Gap each of said LED devices being integrally formed in said crystal by a respective mesa adjacent the back surface of said crystal, at least some of said mesas each including at least one diode having a p-n junction at which light is radiated, said GaP crystal being of a first electrical conductivity type;
   a monolithic planar integrated circuit array of circuit elements corresponding to and adapted for energizing respective ones of said LED devices, said circuit elements having electrodes on a surface of said integrated circuit array facing said light-transmissive X-Y array;
   first interconnection means sandwiched between said arrays for providing electrical interconnections between said electrodes on the surface of said integrated circuit array and respective mesas forming said LED devices, said mesas being contacted by said interconnection means at an area having a second electrical conductivity type; and
   second interconnection means between said arrays for providing electrical interconnection between at least one said electrode on the surface of said integrated circuit array and an area of said monolithic GaP crystal having said first electrical conductivity type;
   said circuit elements being selectively operable for energizing corresponding ones of said LED devices, each said LED device when energized causing emission of light at the p-n junction adjacent the back surface of said light-transmissive array, said light being transmitted through said light-transmissive array for being observed at the front surface thereof opposite said junction.

3. A composite LED display array as set forth in claim 2 wherein adjacent ones said mesas are separated by a grid of deep channels, said deep channels causing said LED devices to be optically isolated one from another.

4. A composite LED display array as set forth in claim 3 wherein each mesa forming a diode comprises a thin surface layer of electrical conductivity type opposite to the electrical conductivity type of said monolithic GaP crystal.

5. A composite LED display array as set forth in claim 4 wherein said surface comprises single crystal GaAsP.

6. A composite LED display array as set forth in claim 5 wherein said LED devices comprise groups of diodes, said groups being adapted to transmit different colors of light.

7. A composite LED display array as set forth in claim 2 wherein at least one of said mesas having no junction therein and having a back surface of said first electrical conductivity type, the last-said mesa surface being contacted by said second interconnection means.

8. A composite LED display array as set forth in claim 7 wherein said first and second interconnection means comprise a plurality of metal spheres or hemispheres positioned between surfaces of said mesas and said electrodes on the surface of said integrated circuit array.

* * * * *